(12) United States Patent
Patanwala et al.

(10) Patent No.: US 11,740,334 B2
(45) Date of Patent: Aug. 29, 2023

(54) CIRCUIT AND METHOD FOR COMBINING SPAD OUTPUTS

(71) Applicant: STMicroelectronics (Research & Development) Limited, Marlow (GB)

(72) Inventors: Sarrah Moiz Patanwala, Edinburgh (GB); Bruce Rae, Edinburgh (GB); Neale Dutton, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 362 days.

(21) Appl. No.: 16/898,600

(22) Filed: Jun. 11, 2020

(65) Prior Publication Data

US 2020/0400792 A1 Dec. 24, 2020

(30) Foreign Application Priority Data

Jun. 18, 2019 (EP) .................................... 19180963

(51) Int. Cl.
| | |
|---|---|
| *G01S 7/4863* | (2020.01) |
| *G01S 7/4865* | (2020.01) |
| *H03K 3/037* | (2006.01) |
| *G01S 17/89* | (2020.01) |

(52) U.S. Cl.
CPC .......... *G01S 7/4863* (2013.01); *G01S 7/4865* (2013.01); *H03K 3/037* (2013.01); *G01S 17/89* (2013.01)

(58) Field of Classification Search
CPC ...... G01S 7/4863; G01S 7/4865; H03K 3/037
See application file for complete search history.

(56) References Cited

U.S. PATENT DOCUMENTS

| | | | |
|---|---|---|---|
| 6,252,428 B1* | 6/2001 | Barsoum ............... | G01R 29/04 327/45 |
| 2014/0103196 A1* | 4/2014 | Soga .................... | G01S 7/4865 250/206 |
| 2018/0246212 A1 | 8/2018 | Moore et al. | |
| 2018/0372538 A1 | 12/2018 | Hata et al. | |
| 2020/0041621 A1* | 2/2020 | Ozaki .................. | G01S 7/4865 |
| 2020/0233068 A1* | 7/2020 | Henderson ........... | G01S 7/4863 |

OTHER PUBLICATIONS

Almer Oscar et al: "From linear to Geiger mode avalanche detectors for ADC-less VLC reciver architectures", 2017 IEEE Photonics Conference (IPC), IEEE, Oct. 1, 2017 (Oct. 1, 2017), pp. 31-32, XP033261575, DOI: 10.1109/IPCON.2017.8115992 [retrieved on Nov. 20, 2017] * chapter II * *FIGURES 1(a), 1(b).
EPO Search Report and Written Opinion for EP Appl. No. 19180963.1 dated Nov. 26, 2019 (10 pages).

* cited by examiner

*Primary Examiner* — Thanh Luu
(74) *Attorney, Agent, or Firm* — CROWE & DUNLEVY (57) ABSTRACT

A combining network for an array of SPAD devices includes: synchronous sampling circuits, wherein each synchronous sampling circuit is coupled to an output of a corresponding SPAD device and is configured to generate a pulse or an edge each time an event is detected; and a summation circuit coupled to an output of each of the synchronous sampling circuits and configured to count a number of pulses or edges to generate a binary output value.

13 Claims, 8 Drawing Sheets

CIRCUIT AND METHOD FOR COMBINING SPAD OUTPUTS

PRIORITY CLAIM

This application claims the priority benefit of European Application for Patent No. 19180963.1, filed on Jun. 18, 2019, the content of which is hereby incorporated by reference in its entirety to the maximum extent allowable by law.

TECHNICAL FIELD

The present disclosure relates generally to the field of time of flight ranging devices, and, in particular, to a circuit and method for combining the outputs of an array of single-photon avalanche diodes (SPADs).

BACKGROUND

The ability of time-of-flight (ToF) cameras based on SPADs to provide precise photon arrival times makes them popular candidates for light detection and ranging (LiDAR) sensors. Such ToF cameras generally comprise a laser source such as a vertical cavity surface-emitting laser (VCSEL) that emits, into an image scene, optical pulses or an optical waveform, and an array of SPADs for detecting the return signal.

In the case of direct ToF (dToF), the time delay of each return pulse with respect to the corresponding transmitted pulse is estimate in order to determine the time-of-flight, which can be converted into a distance measurement.

In the case of indirect ToF (iToF), the phase of the returned waveform is compared with that of the emitted waveform in order to estimate the time-of-flight, which is then converted into a distance measurement.

Scene imaging in certain environments, such as for LiDAR automotive applications, faces challenges due to scanning a wide field-of-view, variations in the target reflectivity, and the harsh ambient conditions.

There is thus a need in the art for a circuit and method for ToF ranging that addresses one or more of these challenges. There is a need in the art to at least partially address one or more needs in the art.

SUMMARY

According to one aspect, there is provided a combining network for an array of SPAD (single-photon avalanche diode) devices, the combining network including: a plurality of synchronous sampling circuits, each synchronous sampling circuit being coupled to the output of a corresponding SPAD device and being configured to generate a pulse or an edge each time an event is detected; and a summation circuit coupled to an output of each of the synchronous sampling circuits and configured to count the number of pulses or edges to generate a binary output value.

According to one embodiment, the summation circuit comprises an adder tree configured to convert an N-bit input into an L-bit output, where N is equal to 4 or more, and $L=\log_2 N$ or $L=\log_2 N+1$.

According to one embodiment, each of the plurality of synchronous sampling circuits comprises a flip-flop having its data input coupled to the output of the corresponding SPAD device, the flip-flops being clocked by a clock signal.

According to one embodiment, the event is in the form of a pulse of a first duration on the output of the corresponding SPAD device, and the clock signal has a period of less than half the first duration.

According to one embodiment, each of the plurality of synchronous sampling circuits comprises an edge detection device configured to detect an edge of a pulse generated by the corresponding SPAD device.

According to one embodiment, each edge detection device includes: a first flip-flop having its data input coupled to the output of the corresponding SPAD device; a second flip-flop having its data input coupled to a data output of the first flip-flop, wherein the first and second flip-flops are clocked by a clock signal; and a logic gate coupled to the data outputs of the first and second flip-flops and configured to detect a rising and/or falling edge at the output of the corresponding SPAD device based on data outputs of the first and second flip-flops.

According to a further aspect, there is provided a ranging device comprising: an array of SPAD devices; the above combining network coupled to the outputs of the array; and a histogram generation circuit configured to accumulate count values generated by the summation circuit in a plurality of time bins.

According to a further aspect, there is provided a method of detecting events in a SPAD (single-photon avalanche diode) array, the method including: generating, by a plurality of synchronous sampling circuits, a pulse or an edge each time an event is detected at an output of a corresponding SPAD device of the SPAD array; and counting, by a summation circuit coupled to an output of each of the synchronous sampling circuits, the number of pulses or edges to generate a binary output value.

According to one embodiment, the method also includes converting, using an adder tree of the summation circuit, an N-bit input into an L-bit output, where N is equal to 4 or more, and $L=\log_2 N$ or $L=\log_2 N+1$.

According to one embodiment, generating the pulse or edge each time an event is detected at an output of the corresponding SPAD device includes sampling, using a flip-flop, the output of the corresponding SPAD device based on a clock signal.

BRIEF DESCRIPTION OF THE DRAWINGS

The Foregoing Features and Advantages, as Well as Others, Will be Described in Detail in the Following Description of Specific Embodiments Given by Way of Illustration and not Limitation with Reference to the Accompanying Drawings, in which.

DETAILED DESCRIPTION

Like features have been designated by like references in the various figures. In particular, the structural and/or functional features that are common among the various embodiments may have the same references and may dispose similar or identical structural, dimensional and material properties.

Unless indicated otherwise, when reference is made to two elements connected together, this signifies a direct connection without any intermediate elements other than conductors, and when reference is made to two elements linked or coupled together, this signifies that these two elements can be connected or they can be linked or coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures, or to a ranging device as orientated during normal use.

Unless specified otherwise, the expressions "around", "approximately", "substantially" and "in the order of" signify within 10%, and preferably within 5%.

Figure 1:
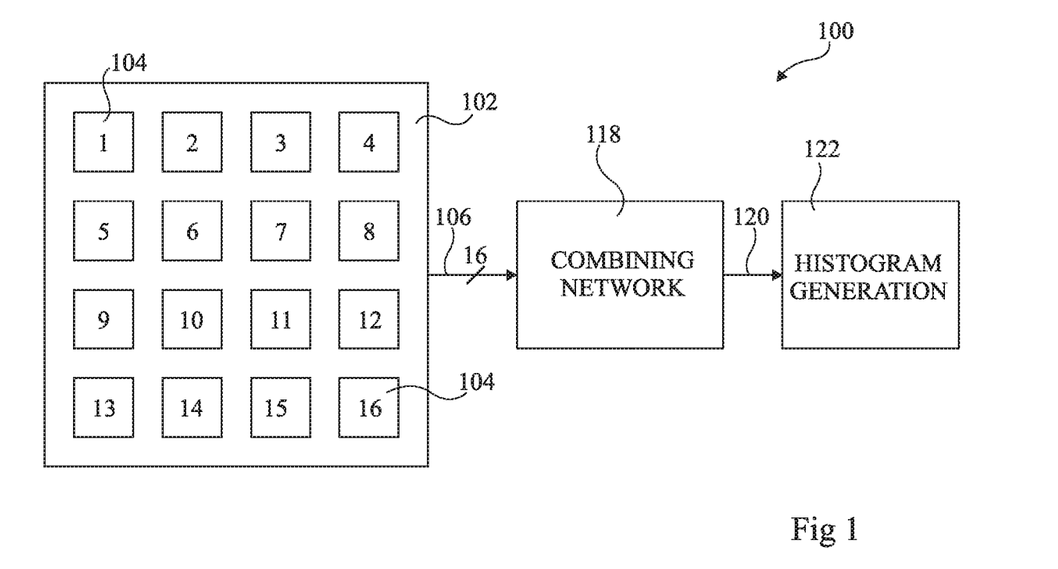
FIG. 1 schematically illustrates a ranging device.

FIG. 1 schematically illustrates a ranging device 100. The ranging device 100 comprises a SPAD array 102 comprising, in the example of FIG. 1, 16 SPAD devices 104 labelled 1 to 16 and arranged in a four by four grid. The output of each SPAD device is provided on a corresponding line of a 16-bit output link 106 to a combining network (COMBINING NETWORK) 118.

An output line 120 of the combining network 118 is for example provided to a histogram generation circuit (HISTOGRAM GENERATION) 122, which for example attributes the samples from the SPAD array 102 to different time bins in order to allow the arrival time of a received light pulse, or phase of a received optical waveform, to be determined.

By providing a SPAD array 102 formed of a plurality of SPAD devices 104, the dynamic range can be increased with respect to the use of a single SPAD device of the same dimensions. The role of the combining network 118 is to condense the outputs from the SPAD devices of the array 102 onto a single output line 120. As will be described in more detail below, the combining network 118 may comprise an OR tree for combining the SPAD outputs.

Figure 2:
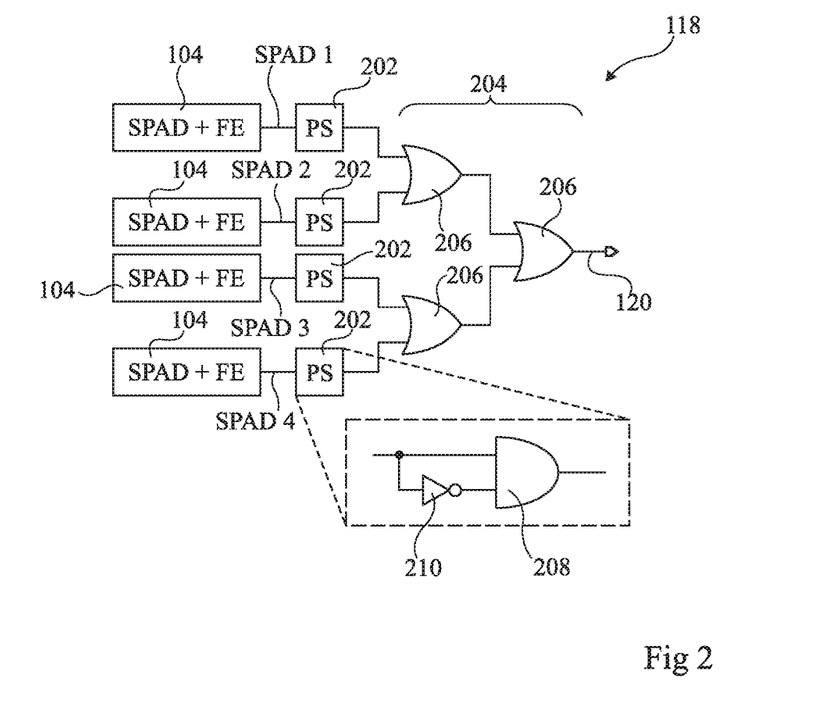
FIG. 2 schematically illustrates a combining network of the ranging device of FIG. 1.

FIG. 2 schematically illustrates the combining network 118 of the ranging device of FIG. 1 based on an OR-tree implementation, and according to a simplified example based on the output signals of four SPAD devices (SPAD+FE) 104 forming the SPAD array 102. Each SPAD device for example includes a front end (FE) circuit comprising a MOS transistor for quench/recharge, and an inverter used to re-buffer the leading edge of the SPAD into a digital pulse.

An output (SPAD 1 to SPAD 4) of each SPAD device 104 is provided to a corresponding pulse shaper (PS) 202, which transforms an event detected by the SPAD device 104 into a pulse of fixed duration. The outputs of the pulse shapers 202 are coupled to an OR-tree 204, which comprises three OR gates 206 in the example of FIG. 2, one of the OR gates having its two inputs respectively coupled to the outputs of two of the pulse shapers 202, another of the OR gates having its two inputs respectively coupled to the outputs of the other two pulse shapers 202, and the third OR gate having its two inputs respectively coupled to the outputs of the other two OR gates. The output of the third OR gate corresponds to the single output line 120 of the combining network 118.

Each of the pulse shapers 202, for example, has its input coupled to one input of an AND gate 208, and also to the second input of the AND gate 208 via an inverter 210.

A drawback of the combining network 118 based on the OR tree of FIG. 2 is that it suffers from photon pile-up distortion, as will now be described in more detail with reference to FIG. 3.

Figure 3:
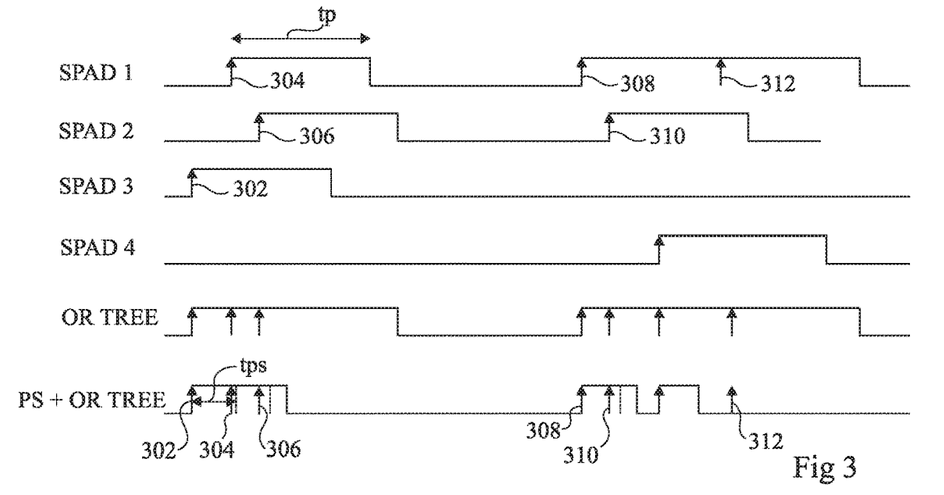
FIG. 3 is a timing diagram representing signals in the circuit of FIG. 2.

FIG. 3 is a timing diagram representing signals in the circuit of FIG. 2. In particular, FIG. 3 illustrates examples of the output signals SPAD 1 to SPAD 4 of the four SPAD devices 104 of FIG. 2, of a signal OR TREE that would be present at the output of the OR tree 204 in the absence of the pulse shapers 202, and a signal PS+OR TREE corresponding to the signal on the output line 120 of the combining network 118 of FIG. 2. A duration tp corresponds to the duration of a pulse on the lines SPAD 1 to SPAD 4 resulting from a SPAD detection event. This pulse duration is reduced to a duration tps by the pulse shapers 202, the dashed lines in the signal PS+OR TREE representing the end of each pulse. However, it can be seen in FIG. 3 that when events occur relatively close together, for example because of high ambient light, saturation of the combining network occurs. This results in photon pile-up distortion in which some events are partially or entirely missed. In a first example in FIG. 3, three events 302, 304 and 306 are separated by less than the shortened duration tps, leading to a distorted output pulse duration that is shorter than 3*tps. In a further example in FIG. 3, two events 308, 310 occur within a duration tps, and thus the resulting pulse has a duration shorter than 2*tps. Furthermore, a further event 312 at the output of SPAD 1 occurs directly after the event 308, and thus the event 312 does not cause a shortened pulse to be generated, and is thus missed entirely.

Figure 4:
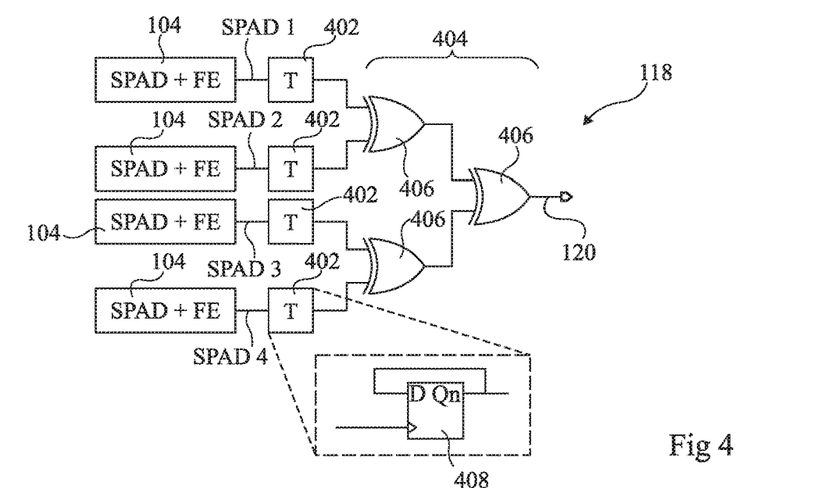
FIG. 4 schematically illustrates a combining network of the ranging device of FIG. 1.

FIG. 4 schematically illustrates the combining network 118 of the ranging device of FIG. 1 based on an XOR tree implementation, and according to the same simplified example of FIG. 2 based on four SPAD devices 104 forming the SPAD array 102. An output (SPAD 1 to SPAD 4) of each SPAD device (SPAD+FE) 104 is provided to a corresponding toggle device (T) 402, which transforms an event detected by the SPAD device 104 into a binary transition from logic "0" to logic "1" or from logic "1" to logic "0". The outputs of the toggle devices 402 are coupled to an XOR tree 404, which comprises three XOR gates 406 in the example of FIG. 4, one of the XOR gates having its two inputs respectively coupled to the outputs of two of the toggle devices 402, another of the XOR gates having its two inputs respectively coupled to the outputs of the other two toggle devices 402, and the third XOR gate having its two inputs respectively coupled to the outputs of the other two XOR gates. The output of the third XOR gate corresponds to the single output line 120 of the combining network 118.

Each of the toggle devices 402 has its input coupled to a clock input of a D-type flip-flop 408, an inverted output Qn of the flip-flop 408 being connected to the data input D of the flip-flop 408.

Like for the OR TREE embodiment of FIG. 2, the XOR TREE embodiment of FIG. 4 can suffer from photon pile-up due to saturation, as will now be described with reference to FIG. 5.

Figure 5:
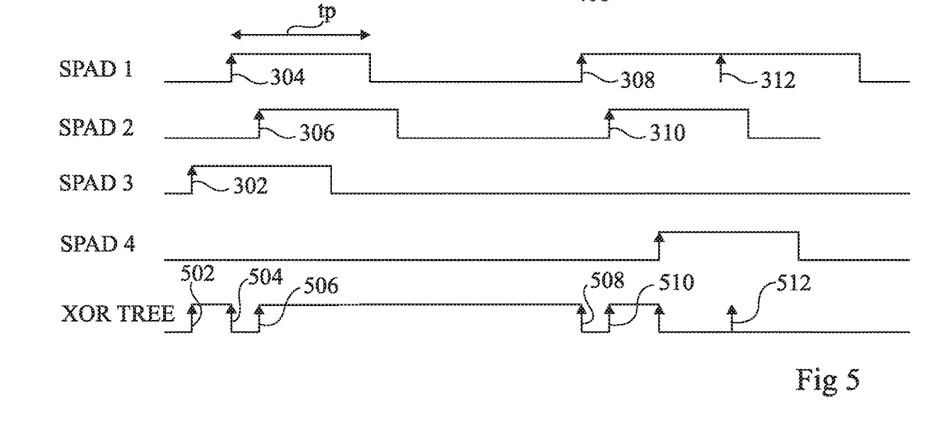
FIG. 5 is a timing diagram representing signals in the circuit of FIG. 4.

FIG. 5 is a timing diagram representing signals in the circuit of FIG. 4. In particular, FIG. 5 illustrates examples of the output signals SPAD 1 to SPAD 4 of the four SPAD devices 104 of FIG. 4, and of a signal XOR TREE corresponding to the signal on the output line 120 of the combining network 118 of FIG. 4. A duration tp corresponds to the duration of a pulse on the lines SPAD 1 to SPAD 4 resulting from a SPAD detection event.

FIG. 5 illustrates the same examples of SPAD events 302 to 312 as shown in FIG. 3. However, while the SPAD events 302 to 310 cause corresponding transitions 502 to 510 in the output signal, like in the example of FIG. 3, the event 312 is missed, as represented by an arrow 512 without any transition. Furthermore, as the rate of incoming photons increases, the frequency of the XOR tree increases. High ambient light can therefore lead to very close 0 to 1 to 0 transitions in the XOR tree, leading to events being missed.

Figure 6:
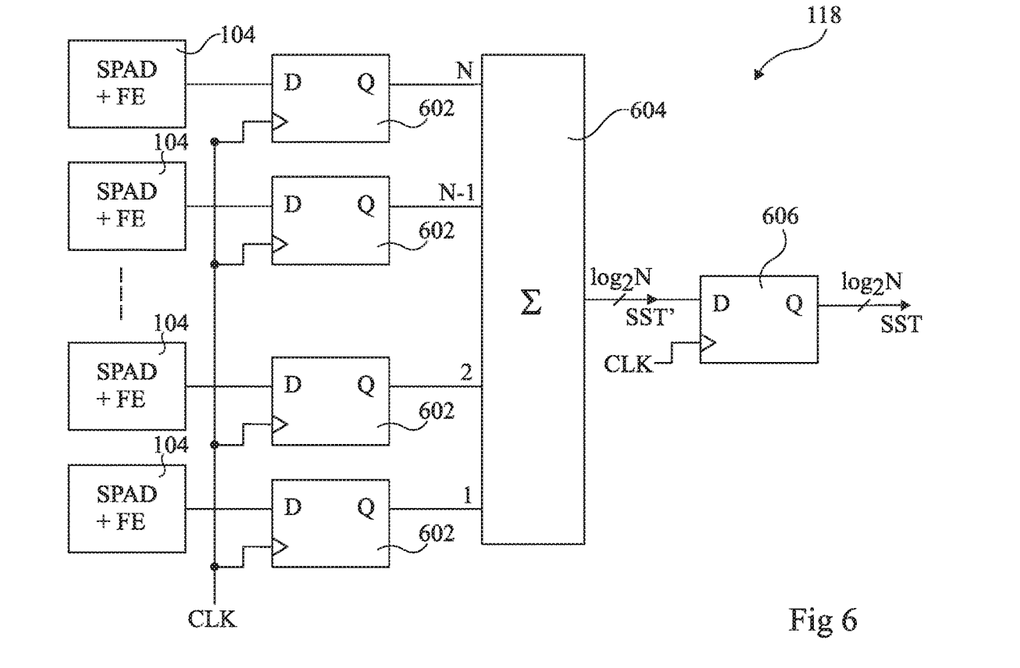
FIG. 6 schematically illustrates a combining network of the ranging device of FIG. 1.

FIG. 6 schematically illustrates the combining network of the ranging device of FIG. 1. The combining network 118 comprises, for example, coupled to the output of each SPAD device 104 forming the SPAD array 102, a corresponding synchronous sampling device 602. In the example of FIG. 6, the synchronous sampling devices 602 are D-type flip-flops clocked by a clock signal CLK, although other implementations of the synchronous sampling devices 602 would be possible. Each D-type flip-flop 602, for example, has its data input D coupled to the output of the corresponding SPAD 104, and its data output Q coupled to a summation circuit 604, which converts N outputs signals from the N synchronous sampling devices 602 into an L-bit signal SST', where $L=\log_2 N$, or $L=\log_2 N+1$ including an overflow bit (described in more detail below), based on the number of sampled signals that are asserted at each edge of the clock signal CLK. The output signal SST' is for example provided to the data input D of a further L-bit D-type flip-flop 606 clocked by the clock signal CLK, and which provides, at its data output Q, an L-bit output signal SST forming the output of the combining network 118. The number N of SPAD devices 104 is for example at least 4.

Figure 7:
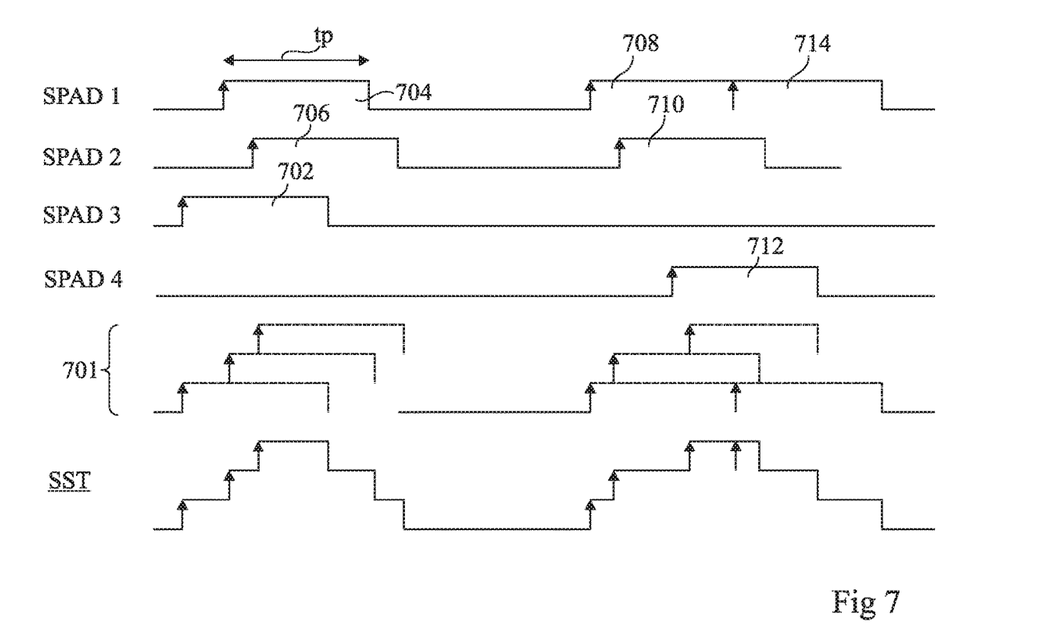
FIG. 7 is a timing diagram representing signals in the circuit of FIG. 6 according to a synchronous sampling method.

Operation of the circuit of FIG. 6 will now be described with reference to FIG. 7. FIG. 7 is a timing diagram representing signals in the circuit of FIG. 6, based on an example of four SPAD devices 104. FIG. 7 illustrates in particular examples of output signals SPAD 1 to SPAD 4 of the four SPAD devices 104, a series of signals 701 representing pulse additions, and the output signal SST, which is a 4-bit signal in this example (although a 2-bit signal could be used).

A duration tp in FIG. 7 corresponds to the duration of a pulse on the lines SPAD 1 to SPAD 4 resulting from a SPAD detection event. In one embodiment, this duration is equal to around 5 ns, although other durations would be possible. The period of the clock signal CLK is for example equal to or less than half the duration tp, and in some embodiments is at least four times shorter than the duration tp.

The synchronous sampling devices 602, for example, sample the signals SPAD 1 to SPAD 4 on each rising edge of the clock signal CLK. Thus, the generated output pulses have rising and falling edges synchronized with the clock signal CLK. These pulses are represented by the signals 701, in which overlapping pulses of the signals SPAD 1 to SPAD 4 are shown stacked, as these pulses will be added by the summation circuit 604. The output signal SST thus represents, at each significant edge of the clock signal CLK, the number of signals SPAD 1 to SPAD 4 that is asserted.

In the example, of FIG. 7, initially none of the signals SPAD 1 to SPAD 4 are asserted, and thus the signal SST is at zero. A pulse 702 initially occurs on the signal SPAD 3, causing the signal SST to rise to 1, e.g. a 4-bit binary value of "0001". A pulse 704 then occurs shortly thereafter on the signal SPAD 1, causing the signal SST to rise to 2, e.g. a 4-bit binary value of "0010", followed by a pulse 706 on the signal SPAD 2, causing the signal SST to rise to 3, e.g. a 4-bit binary value of "0011". The ends of the pulses 702, 704 and 706 then arrive one after the other, respectively causing the output signal SST to fall back to 2, and then to 1, and then to zero.

In another example in FIG. 7, a pulse 708 initially occurs on the signal SPAD 1, causing the signal SST to rise to 1, e.g. a 4-bit binary value of "0001". A pulse 710 then occurs shortly thereafter on the signal SPAD 2, causing the signal SST to rise to 2, e.g., a 4-bit binary value of "0010", followed by a pulse 712 on the signal SPAD 3, causing the signal SST to rise to 3, e.g., a 4-bit binary value of "0011". A further pulse 714 then occurs on the signal SPAD 1 directly after the pulse 708. However, in view of the sampling of the signal SPAD 1, this pulse 714 having no rising edge is not missed, and causes the signal SST to remain at 3, e.g., the 4-bit binary value of "0011", after the end of the pulse 708. The ends of the pulses 710, 712 and 714 then arrive one after the other, respectively causing the output signal SST to fall back to 2, and then to 1, and then to zero.

FIG. 7 illustrates an example according to which the summation circuit 604 generates output count values when the number of high pulses changes, corresponding to the starts and ends of each pulse of the input signals. In alternative embodiments, the summation circuit 604 is configured to generate a count value based on a regular sampling of the SPAD signals, and in particular based on the number of pulses currently asserted, as will now be described in more detail with reference to FIG. 8.

Figure 8:
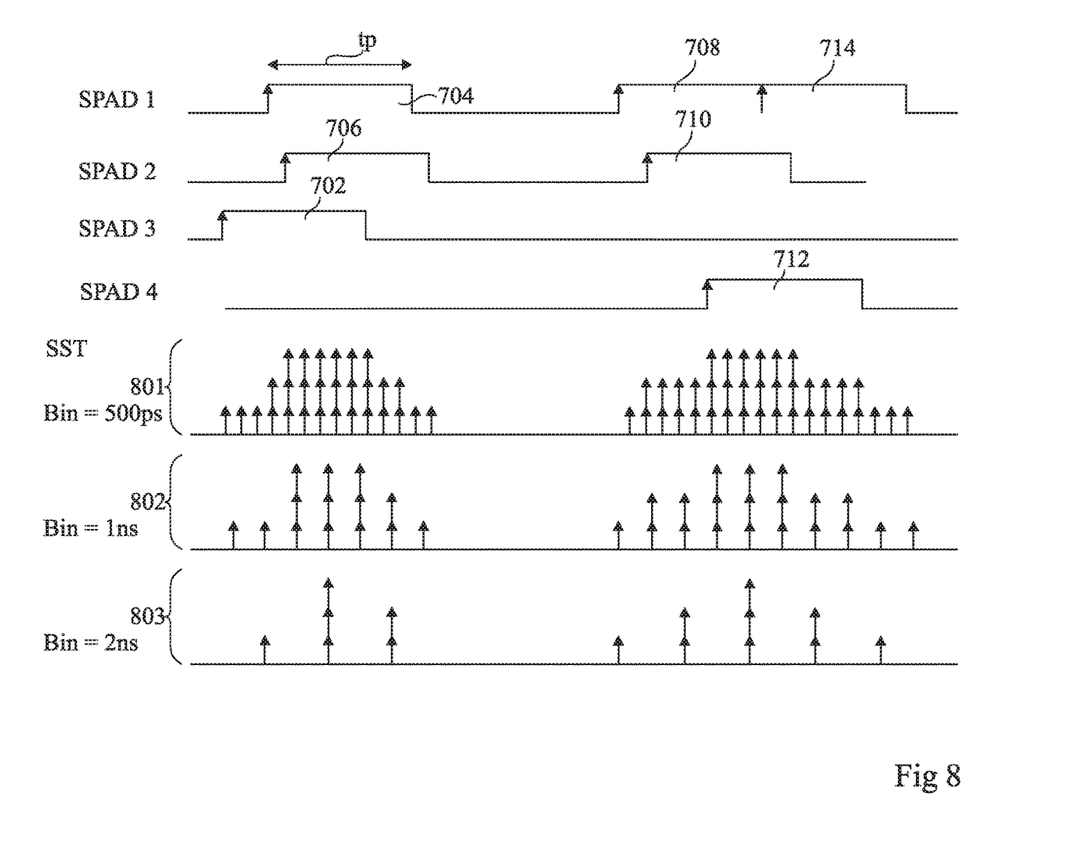
FIG. 8 is a timing diagram representing signals in the circuit of FIG. 6 according to continuous synchronous sampling method.

FIG. 8 is a timing diagram representing signals in the circuit of FIG. 6 according to continuous synchronous sampling method. FIG. 8 illustrates the same example of the SPAD output signals SPAD 1, SPAD 2, SPAD 3 and SPAD 4 of FIG. 7, and also illustrates three examples 801, 802 and 803 of the output signal SST based respectively on sampling periods Bin of 500 ps, 1 ns and 2 ns. The signals 801, 802 and 803 of FIG. 8 use vertical arrows to indicate the output count signal SST at each sampling time. The number of generated samples can be reduced in the example of FIG. 8 by increasing the sampling period, as represented by the examples 802 and 803, at the expense of reduced precision concerning the pulse timing.

Figure 9:
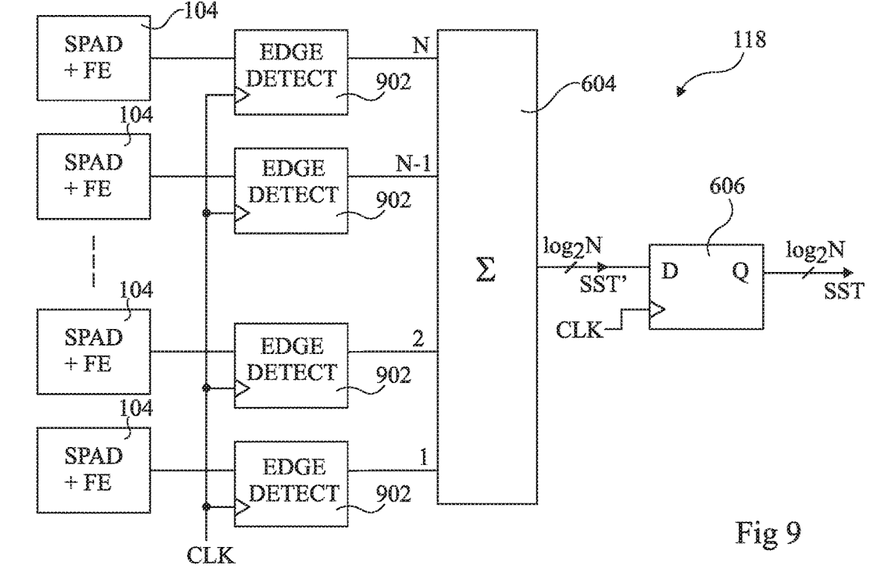
FIG. 9 schematically illustrates a combining network of the ranging device of FIG. 1.

FIG. 9 schematically illustrates the combining network 118 of the ranging device of FIG. 1. The embodiment of FIG. 9 is similar to that of FIG. 6, except that, rather than being implemented by flip-flops 602, the synchronous sampling devices are implemented by edge detection devices (EDGE DETECT) 902 each of which is clocked by the clock signal CLK.

Figure 10:
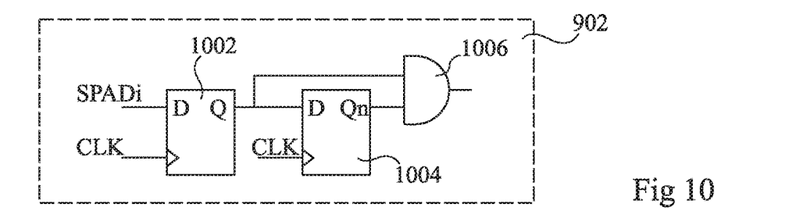
FIG. 10 schematically illustrates an edge detection circuit of FIG. 9.

FIG. 10 schematically illustrates one of the detection devices 902 of FIG. 9 in more detail. Each of the devices 902 of FIG. 9 is, for example, implemented by a similar circuit to that of FIG. 10. The device 902 for example comprises a flip-flop 1002 having its data input D receiving the corresponding output signal SPADi from one of the SPAD device 104, and its data output Q coupled to the date input D of a further flip-flop 1004. The further flip-flop 1004 has its inverted output Qn coupled to one input of an AND gate 1006, the other input of which is coupled to the date output Q of the flip-flop 1002. The flip-flops 1002, 1004 are each clocked by the clock signal CLK.

Thus, the edge detection device 902 samples the signals SPADi on each significant edge of the clock signal CLK, but outputs a high signal when a rising edge is detected. Of course, in the case that the SPAD devices 104 output falling edges in response to a detected event, the edge detection devices 902 could be modified to detect falling edges by coupling the AND gate input and the data input D of the flip-flop 1004 to an inverted output Qn of the flip-flop 1002 rather that to its data output Q, and by coupling the input of the AND gate 1006 to the data output Q of the flip-flop 1004 rather than to its inverted output Qn.

Figure 11:
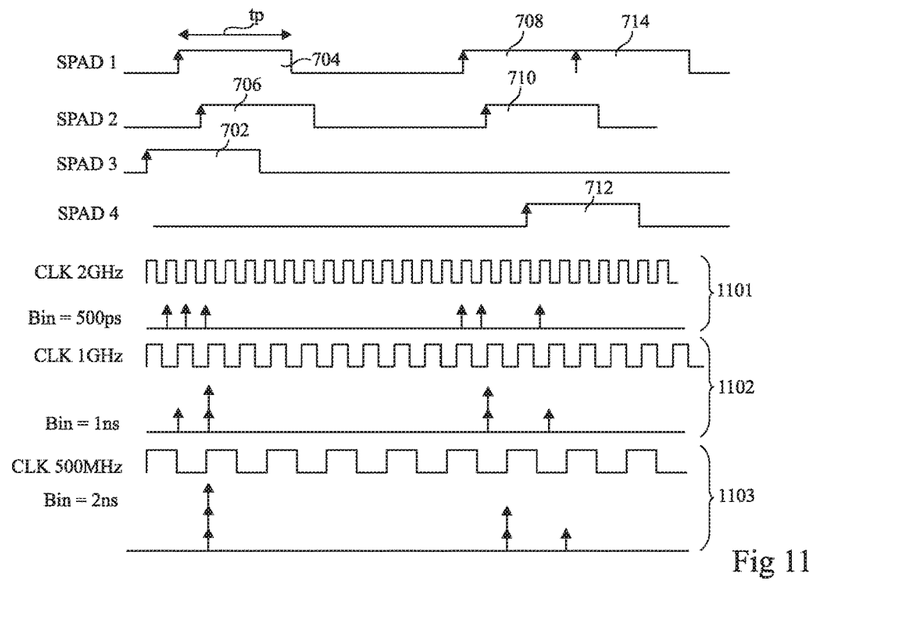
FIG. 11 is a timing diagram representing signals in the circuits of FIGS. 9 and 10.

FIG. 11 is a timing diagram representing signals in the circuit of FIGS. 9 and 10. FIG. 11 illustrates the same example of the SPAD output signals SPAD 1, SPAD 2, SPAD 3 and SPAD 4 of FIG. 7, and also illustrates three examples 1101, 1102 and 1103 of different frequencies of the sampling clock signal CLK and of the corresponding output signal SST. The sampling periods Bin of the examples 1101, 1102 and 1103 are respectively of 500 ps, 1 ns and 2 ns in the example of FIG. 11.

It can be seen that in the example of FIG. 11, the output count value SST corresponds to the number of edges detected during a period of the clock signal CLK.

Figure 12:
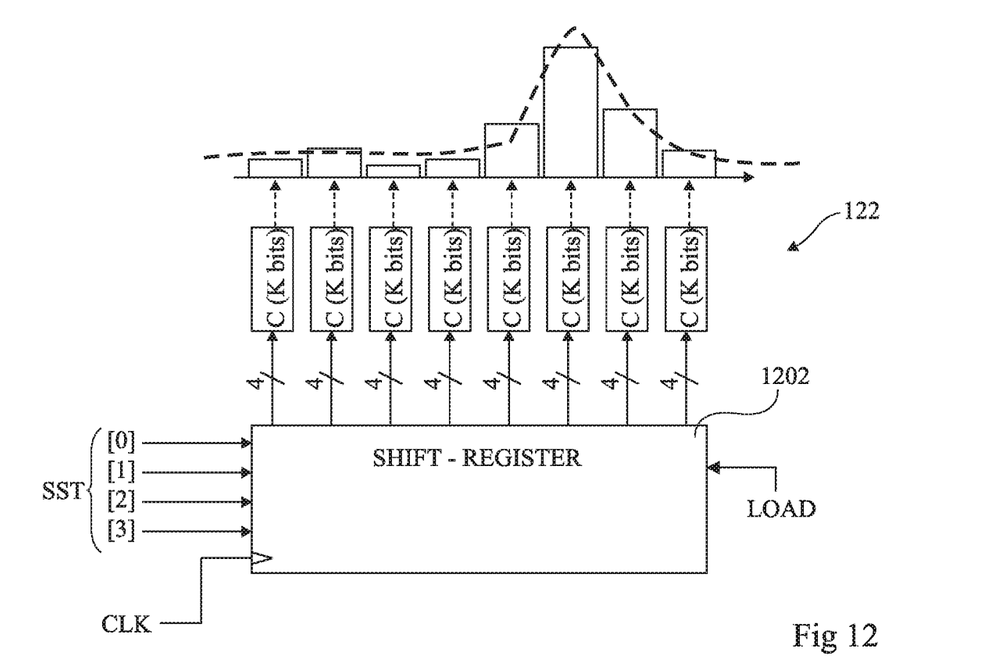
FIG. 12 schematically illustrates a histogram generation circuit of the ranging device of FIG. 1 for a dToF implementation.

FIG. 12 schematically illustrates the histogram generation circuit 122 of the ranging device of FIG. 1 for a dToF implementation, based on the signal SST generated by the summation circuit 604 of FIG. 6 or 9.

The example of FIG. 12 is based on M histogram bins, where M is equal to 8 in the example of FIG. 12. The circuit 122 for example comprises a shift-register (SHIFT-REGISTER) 1202 receiving the L-bit values SST, where L is equal to 4 in the example of FIG. 12. The shift-register 1202 stores M values of the signal SST, which are shifted at the frequency of the clock signal CLK. Every time that M values have been brought into the shift-register 1202, a load signal LOAD is asserted causing the L-bit value in each of the bins of the shift-register 1202 to be output to a corresponding one of M counters C. Each counter C is for example a K-bit counter, and permits a histogram to be generated for J received pulses, where K is for example equal to between 4 and 32, and J is for example equal to at least 10 and typically equal to several hundred.

The histogram resulting from the cumulative count values of the M counters C can be used to determine an average time-of-flight of the light pulses, and thus determine a range, while also detecting and cancelling cross-talk.

Figure 13:
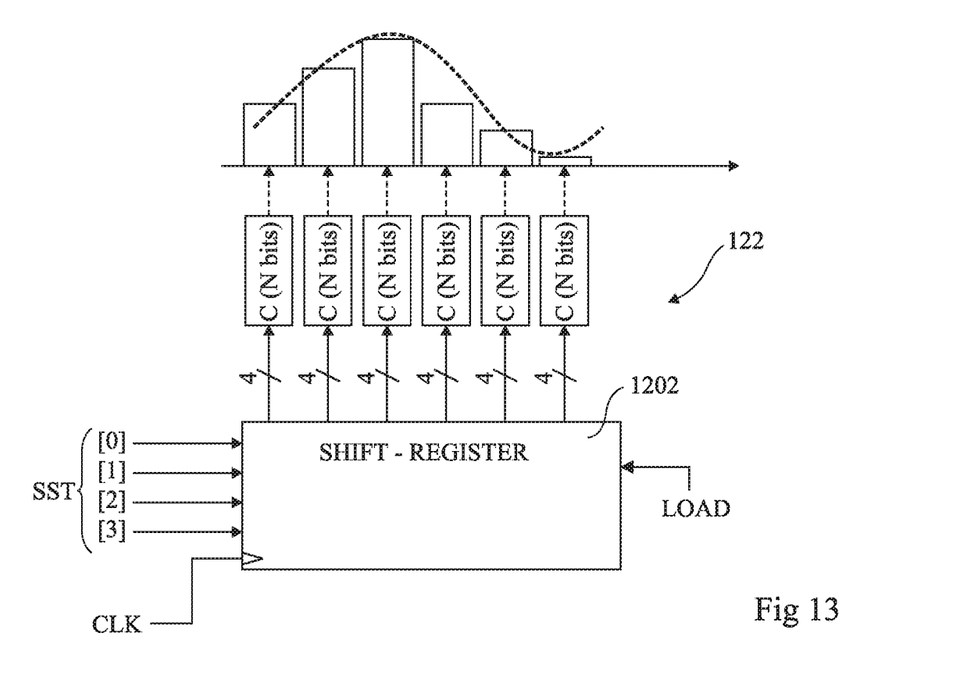
FIG. 13 schematically illustrates a histogram generation circuit of the ranging device of FIG. 1 for an iToF implementation.

FIG. 13 schematically illustrates a histogram generation circuit of the ranging device of FIG. 1 for an iToF implementation, based on the signal SST generated by the summation circuit 604 of FIG. 6 or 9. The circuit 122 of FIG. 13 is the same as that of FIG. 12, except that the shift-register 1202 of FIG. 13 has a number of bins M adapted to the detection of a phase of a waveform. For example, in the case of an iToF implementation, the number M of bins can be as low as 2 bins, and in the example of FIG. 13 there are 6 bins.

Figure 14:
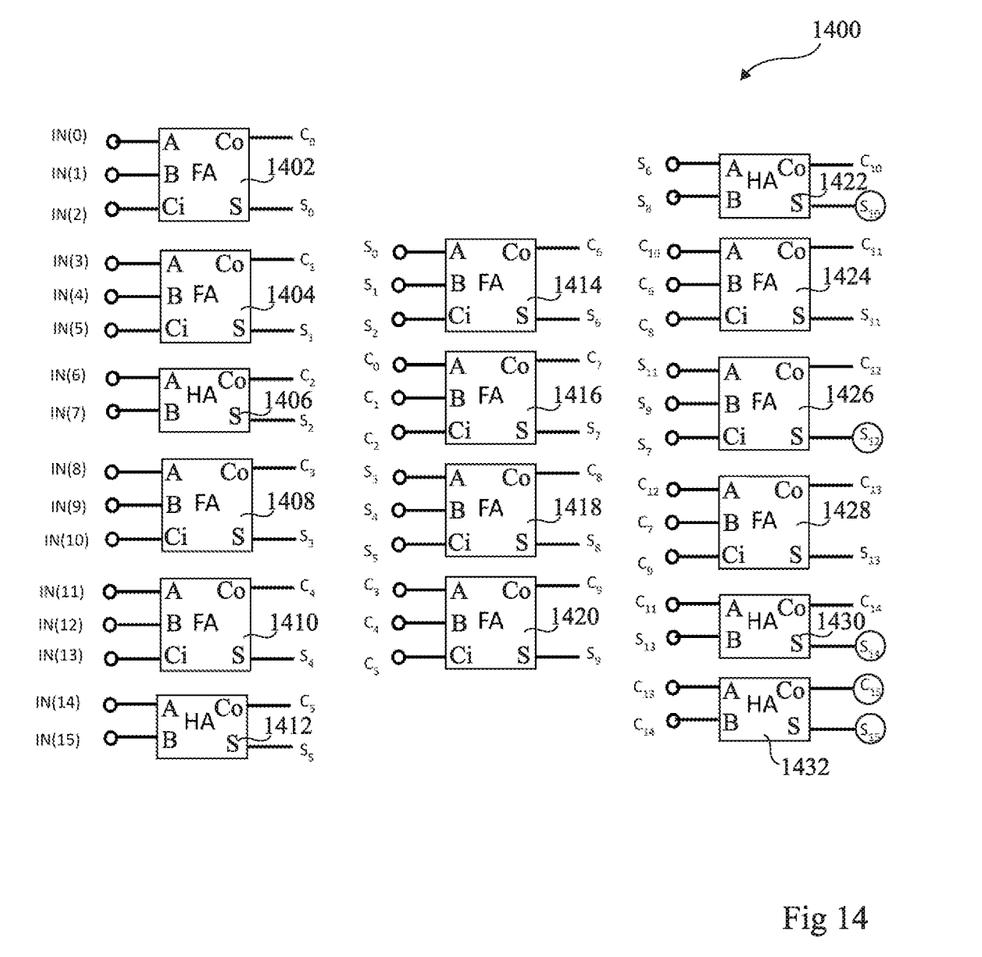
FIG. 14 schematically illustrates an adder tree for implementing the summation circuit of FIGS. 6 and 9.

FIG. 14 schematically illustrates an adder tree 1400 for implementing the summation circuit 604 of FIGS. 6 and 9.

The example of FIG. 14 is based on full adders (FA) and half adders (HA), and on 16 input bits IN(0) to IN(15), which for example correspond to the signals provided by corresponding ones of the flip-flips 602 of FIG. 6 or the edge detection devices 902 of FIG. 9.

Each full adder FA has inputs A and B, a carry input Ci, a sum output S and carry output Co. Each half adder HA has inputs A and B, a sum output S, and a carry output Co.

The adder tree 1400 for example comprises: a full adder 1402 receiving at its inputs A, B and Ci the signals IN(0), IN(1) and IN(2) respectively, and providing, at its sum output S, a sum value $S_0$, and at its carry output Co, a carry value $C_0$; a full adder 1404 receiving at its inputs A, B and Ci the signals IN(3), IN(4) and IN(5) respectively, and providing, at its sum output S, a sum value $S_1$, and at its carry output Co, a carry value $C_1$; a half adder 1406 receiving at its inputs A and B the signals IN(6) and IN(7) respectively, and providing, at its sum output S, a sum value $S_2$, and at its carry output Co, a carry value $C_2$; a full adder 1408 receiving at its inputs A, B and Ci the signals IN(8), IN(9) and IN(10) respectively, and providing, at its sum output S, a sum value $S_3$, and at its carry output Co, a carry value $C_3$; a full adder 1410 receiving at its inputs A, B and Ci the signals IN(11), IN(12) and IN(13) respectively, and providing, at its sum output S, a sum value $S_4$, and at its carry output Co, a carry value $C_4$; and a half adder 1412 receiving at its inputs A and B the signals IN(14) and IN(15) respectively, and providing, at its sum output S, a sum value $S_5$, and at its carry output Co, a carry value $C_5$.

The adder tree 1400 also for example comprises: a full adder 1414 receiving at its inputs A, B and Ci the values $S_0$, $S_1$ and $S_2$ respectively, and providing, at its sum output S, a sum value $S_6$, and at its carry output Co, a carry value $C_6$; a full adder 1416 receiving at its inputs A, B and Ci the values $C_0$, $C_1$ and $C_2$ respectively, and providing, at its sum output S, a sum value $S_7$, and at its carry output Co, a carry value $C_7$; a full adder 1418 receiving at its inputs A, B and Ci the values $S_3$, $S_4$ and $S_5$ respectively, and providing, at its sum output S, a sum value $S_8$, and at its carry output Co, a carry value $C_8$; and a full adder 1420 receiving at its inputs A, B and Ci the values $C_3$, $C_4$ and $C_5$ respectively, and providing, at its sum output S, a sum value $S_9$, and at its carry output Co, a carry value $C_9$.

The adder tree 1400 also for example comprises: a half adder 1422 receiving at its inputs A and B the values $S_6$ and $S_8$ respectively, and providing, at its sum output S, a sum value $S_{10}$, and at its carry output Co, a carry value $C_{10}$; a full adder 1424 receiving at its inputs A, B and Ci the values $C_{10}$, $C_6$ and $C_8$ respectively, and providing, at its sum output S, a sum value $S_{11}$, and at its carry output Co, a carry value $C_{11}$; a full adder 1426 receiving at its inputs A, B and Ci the values $S_{11}$, $S_9$ and $S_7$ respectively, and providing, at its sum output S, a sum value $S_{12}$, and at its carry output Co, a carry value $C_{12}$; a full adder 1428 receiving at its inputs A, B and Ci the values $C_{12}$, $C_7$ and $C_9$ respectively, and providing, at its sum output S, a sum value $S_{13}$, and at its carry output Co, a carry value $C_{13}$; a half adder 1430 receiving at its inputs A and B the values $C_{11}$ and $S_{13}$ respectively, and providing, at its sum output S, a sum value $S_{14}$, and at its carry output Co, a carry value $C_{14}$; and a half adder 1432 receiving at its inputs A and B the values $C_{13}$ and $C_{14}$ respectively, and providing, at its sum output S, a sum value $S_{15}$, and at its carry output Co, a carry value $C_{15}$.

The sum values $S_{10}$, $S_{12}$, $S_{14}$ and $S_{15}$ for example provide the 4-bit output value OUT(0) to OUT(3) of the adder tree respectively, and the carry value $C_{15}$ for example provides a carry output. This carry output is for example used as an overflow flag, in which case the number of output bits L is for example equal to $\log_2 N+1$. For example, when asserted, the count value is held at a maximum value, thereby avoiding a case in which the count value will roll-over to zero if the maximum count value is exceeded.

Figure 15:
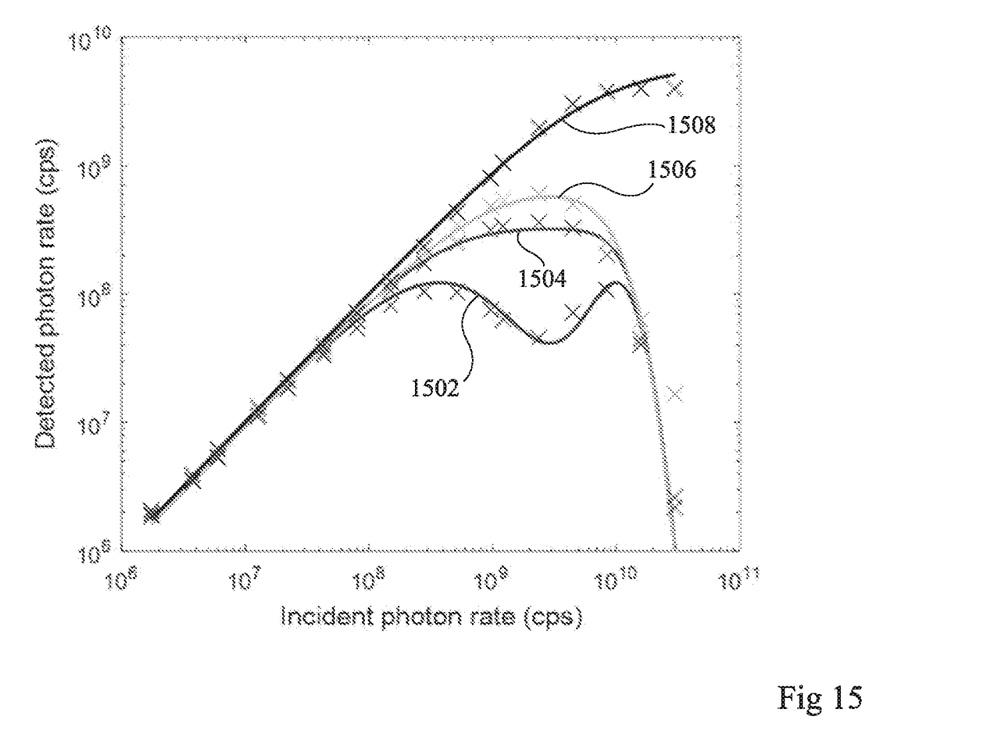
FIG. 15 is a graph representing a detected photon rate as a function of an incident photon rate for four different types of combining networks.

FIG. 15 is a graph representing a detected photon rate as a function of an incident photon rate for four different types of combining networks. The photon rates are expressed in counts per second (cps).

A curve 1502 in FIG. 15 represents a simulated detected photon rate based on the OR tree combining network of FIG. 2, but without the pulse shapers 202.

A curve 1504 in FIG. 15 represents a simulated detected photon rate based on the OR tree combining network of FIG. 2 with the pulse shapers 202.

A curve 1506 in FIG. 15 represents a simulated detected photon rate based on the combining network of FIG. 9 with synchronous sampling devices in the form of edge detection devices 902.

A curve 1508 in FIG. 15 represents a simulated detected photon rate based on the combining network of FIG. 6 with synchronous sampling devices in the form of flip-flops 602.

Crosses close to each of the curves 1502 to 1508 show measured detected photon rates.

It can be seen from the curves 1506 and 1508 of FIG. 15 that, advantageously, significant improvements in the detected photon rate can be achieved when synchronous sampling devices are used to sample the SPAD outputs, and a summation circuit is then used to evaluate the number of detected events. In particular, the detected photon rate is relatively high even when the incident photon rate exceeds $10^9$ cps and approaches $10^{10}$ cps.

Various embodiments and variants have been described. Those skilled in the art will understand that certain features of these embodiments can be combined and other variants will readily occur to those skilled in the art. For example, it will be apparent to those skilled in the art that the particular implementation of the adder tree of FIG. 14 is merely one example, and that there are various other implementations that would be possible.

The invention claimed is:

1. A combining network for an array of single-photon avalanche diode (SPAD) devices, comprising:
a plurality of synchronous sampling circuits, each synchronous sampling circuit being directly electrically connected to an output of a corresponding SPAD device and being configured to cause a logic high transition of its output at each rising edge of a clock signal where an output of the corresponding SPAD device is at a logic high at the rising edge as a result of a detection event but maintain its output at a logic low at each rising edge of the clock signal where the output of the corresponding SPAD device is not at a logic high at the rising edge as a result of a lack of a detection event;
a summation circuit directly electrically connected to an output of each of the synchronous sampling circuits and configured to count a number of logic high transitions at each rising edge of the clock signal to generate a binary output value representing the number of logic high transitions at that rising edge of the clock signal;
a multi-bit output flip-flop directly electrically connected to an output of the summation circuit to receive the binary output value; and
a histogram generation circuit directly electrically connected to an output of the multi-bit output flip-flop to receive the binary output value.

2. The combining network of claim 1, wherein the summation circuit comprises an adder tree configured to convert an N-bit input into an L-bit output, where N is equal to 4 or more, and $L=\log_2 N+1$.

3. The combining network of claim 1, wherein each of the plurality of synchronous sampling circuits comprises a flip-flop having a data input directly electrically connected to the output of the corresponding SPAD device, the flip-flops being clocked by the clock signal.

4. The combining network of claim 3, wherein the detection event is a pulse of a first duration on the output of the corresponding SPAD device, and the clock signal has a period of less than half the first duration.

5. A ranging device, comprising:
an array of SPAD devices;
a combining network comprising:
a plurality of synchronous sampling circuits, each synchronous sampling circuit being coupled to an output of a corresponding SPAD device from the array of SPAD devices and being configured to cause a logic high transition of its output at each rising edge of a clock signal where an output of the corresponding SPAD device is at a logic high at the rising edge as a result of a detection event but maintain its output at a logic low at each rising edge of the clock signal where the output of the corresponding SPAD device is not at a logic high at the rising edge as a result of a lack of a detection event; and
a summation circuit coupled to an output of each of the synchronous sampling circuits and configured to count a number of logic high transitions at each rising edge of the clock signal to generate a binary output value representing the number of logic high transitions at that clock pulse; and
a histogram generation circuit configured to accumulate the binary output values generated by the summation circuits in a plurality of time bins.

6. The ranging device of claim 5, wherein the summation circuit comprises an adder tree configured to convert an N-bit input into an L-bit output, where N is equal to 4 or more, and $L=\log_2 N+1$.

7. The ranging device of claim 5, wherein each of the plurality of synchronous sampling circuits comprises a flip-flop having a data input coupled to the output of the corresponding SPAD device, the flip-flops being clocked by the clock signal.

8. The ranging device of claim 7, wherein the detection event is a pulse of a first duration on the output of the corresponding SPAD device, and the clock signal has a period of less than half the first duration.

9. The ranging device of claim 5, wherein each of the plurality of synchronous sampling circuits comprises an edge detection device configured to detect an edge of a pulse generated by the corresponding SPAD device.

10. The ranging device of claim 9, wherein each edge detection device comprises:
a first flip-flop having a data input coupled to the output of the corresponding SPAD device;
a second flip-flop having a data input coupled to a data output of the first flip-flop, wherein the first and second flip-flops are clocked by the clock signal; and
a logic gate coupled to data outputs of the first and second flip-flops and configured to detect an edge at the output of the corresponding SPAD device based on data outputs of the first and second flip-flops.

11. A method of detecting events in a single-photon avalanche diode (SPAD) array, the method comprising:
  causing, by a plurality of synchronous sampling circuits, a logic high transition at each rising edge of a clock signal where an output of a corresponding SPAD device of the SPAD array is at a logic high at the rising edge of the clock signal but maintain the output at a logic low where the output of the corresponding SPAD device is not at a logic high at the rising edge of the clock signal;
  counting, by a summation circuit coupled to an output of each of the synchronous sampling circuits, a number of logic high transitions at each rising edge of the clock signal to generate a binary output value representing the number of logic high transitions at that rising edge of the clock signal; and
  generating a histogram from the binary output values.

12. The method of claim 11, further comprising converting, using an adder tree of the summation circuit, an N-bit input into an L-bit output, where N is equal to 4 or more, and $L=\log_2 N+1$.

13. The method of claim 11, wherein causing the logic high transition each time an event is detected at the output of the corresponding SPAD device comprises sampling, using a flip-flop, the output of the corresponding SPAD device based on the clock signal.

* * * * *